United States Patent [19]

Iida

[11] Patent Number: 4,748,594

[45] Date of Patent: May 31, 1988

[54] INTEGRATED CIRCUIT DEVICE HAVING A MEMORY AND MAJORITY LOGIC

[75] Inventor: Norihiko Iida, Tokyo, Japan

[73] Assignee: NEC Corporation, Tokyo, Japan

[21] Appl. No.: 797,268

[22] Filed: Nov. 12, 1985

[30] Foreign Application Priority Data

Nov. 12, 1984 [JP] Japan .................................. 59-237923

[51] Int. Cl.$^4$ .............................................. G11C 29/00
[52] U.S. Cl. .................................... 365/200; 307/464; 371/10; 371/36
[58] Field of Search ...................... 365/189, 200, 201; 371/10, 36, 21; 307/464; 357/23.5

[56] References Cited

U.S. PATENT DOCUMENTS

| | | | |
|---|---|---|---|
| 3,681,578 | 8/1972 | Stevens | 371/36 |
| 3,863,215 | 1/1975 | McGrogan, Jr. | 371/36 X |
| 4,375,683 | 3/1983 | Wensley | 371/36 |
| 4,592,024 | 5/1986 | Sakai et al. | 365/200 |

Primary Examiner—James W. Moffitt
Assistant Examiner—Alyssa H. Bowler
Attorney, Agent, or Firm—Sughrue, Mion, Zinn, Macpeak & Seas

[57] ABSTRACT

An integrated circuit device having a memory. A plurality of identical versions of a given piece of data may be stored at different addresses in the memory, and portions thereof read out in time-division fashion through a reduced number of sense amplifiers and common signal lines to majority logic circuitry, so as to enhance reliability while at the same time reducing the amount of area required on an integrated circuit chip.

3 Claims, 5 Drawing Sheets

INTEGRATED CIRCUIT DEVICE HAVING A MEMORY AND MAJORITY LOGIC

INDUSTRIAL FIELD FOR APPLICATION

The present invention relates to an integrated circuit device having a memory, and more particularly to an integrated circuit device having, on a semiconductor chip, a memory in which important information or information which needs to be retained for a long period is to be recorded.

PRIOR ART

Heretofore, as means for recording information, memories (including register) composed of semiconductor elements such as bipolar transistors, insulated gate type transistors or the like have been widely used. Various kinds of memories have been proposed, including, for instance, a readable and writable memory (RAM), a read-only memory (ROM), a programmable read-only memory (PROM), and a mask type ROM. Recently, non-volatile memories which can store information for a long period have been put to practical use. Furthermore, a rewritable memory in which written information can be erased by either electrical means or optical means and new information can be written, also has been proposed.

Such memories are widely employed in various fields because of their small size, light weight and other similarly favorable properties. For instance, a non-volatile memory is provided on the same chip as a microprocessor and is used as an important element such as a parameter flag, because information stored therein is not destroyed even if power is cut off.

However, these memories are not 100% reliable, and it is in itself impossible to produce 100% reliable memories. In a certain kind of memory, erroneous information may be stored in a writing operation. Moreover, during the period when information is being stored, the information may disappear or may be rewritten as different information. On the other hand, even if writing and storing of information is perfect, erroneous information may be read-out. Furthermore, a semiconductor memory element may have defects or may deteriorate during use. For instance, in the erasable and writable non-volatile memory, it has become an issue that as the number of times of erasing and writing is increased, irregular defects are generated. Especially, in a memory making use of a floating gate, where writing and erasing are effected by utilizing the Fowler-Nordheim tunnel phenomena, charging and discharging of electric charge are effected for that purpose through a very thin insulating film 10 nm or less in thickness. Accordingly, as the number of times of erasing and writing is increased, a defect rate of the insulator film becomes high, and the reliability is remarkably reduced.

For the above-mentioned reasons, users could not rely on memories. Especially where important information is dealt with such as a banking system, IC cards, etc., the above-described memory defects could cause serious accidents. However, no matter how memory technology may advance, appearance of memories having a 100% reliability would be nearly impossible.

In view of the above-mentioned practical circumstance, as means for enhancing memory reliability, the invention disclosed in Laid-Open Japanese Patent Application No. 59-144097 (laid-open on Aug. 17, 1984) was proposed. Here, improvement in a reliability of memories was tried by making use of the majority logic algorithm. A hardware logic circuit for executing the majority logic algorithm was already known in other fields of the art. In the specification of the above-referred patent application, a reliability of stored information was enhanced by adding the well-known majority logic circuit to a read circuit of a memory. More particularly, the same information is separately preliminarily recorded in a memory at least three times, and all three versions are read-out simultaneously. The read-out versions are simultaneously input to the majority logic circit, where a majority decision is effected. An output of this majority logic circuit is manipulated as information read out of the memory.

According to such circuit, if, for example, three sets of the same information are prepared, even if one of them should become erroneous due to a memory defect, the remaining two versions will have the same contents. Therefore, among the above-mentioned remaining two versions, one is selected and output from the majority logic circuit. As a result, even if a memory defect should occur, correct information can be read out of the memory.

However, in the proposed memory circuit as described above, three or more sets of preliminarily prepared information must be read out simultaneously by designating the same address. Generally, information fed from a memory cell is read out via a sense amplifier. Accordingly, a plurality of sense amplifiers is necessary, and there is a shortcoming that a large amount of area would be occupied on a semiconductor chip. Furthermore, due to the fact that in a large-capacity memory, a capacitance added to a sense amplifier is large and hence a large sense amplifier is required, the area occupied by the memory making use of a majority decision circuit becomes even greater. Especially in a chip having functions other than a memory associated therewith (for instance, a microprocessor), increase in memory size would become a great problem.

Furthermore, since information must be transferred from a plurality of dispersed memory blocks to the majority logic circuit, wiring lengths from the memory blocks to the majority logic circuit are long and the layout of the wirings is very complex. Accordingly, on a semiconductor chip, a multi-layer wiring technique must be fully employed. However, in a semiconductor chip, capacitive coupling between wiring layers is liable to occur, the hence the transferred information is liable to change. Hence, even though a majority decision circuit is employed, there still exists a large shortcoming that the information would change between the memory and the majority decision circuit and reliability would be lowered remarkably.

The above-described shortcomings become more significant as the number of sets of information to which majority logic is to be applied increases. Accordingly, in a memory for storing very important information, the proposed technique is not completely satisfactory.

An object of the present invention is to provide an integrated circuit device having a highly reliable memory.

Another object of the present invention is to provide an integrated circuit device having a memory provided with a majority logic circuit which can be realized with a small hardware region.

Still another object of the present invention is to provide an integrated circuit device of high reliability including a memory with a small wiring capacitance.

The memory provided in the integrated circuit device according to the present invention comprises memory means capable of recording a plurality of sets of given information, means for reading out, on a time-division basis, those sets of information, latch means for temporarily storing the earlier read-out information, means for performing a majority logic operation on the sets of the read-out information, and means for taking out correct information from the majority logic operation performing means.

The reading-out means according to the present invention is constructed in such manner that the plurality of sets of information recorded in the memory means are read out through a single sense amplifier on a time-division basis according to a plurality of timing signals which are generated respectively at different timings. Furthermore the above-mentioned plurality of sets of information are located at different address locations, respectively. The plurality of sets of information read out on a time-division basis are transferred to the majority logic circuit through a common signal line.

According to the present invention, the plurality of sets of information are read out serially and fed to the majority logic circuit via the same sense amplifier and through the same signal line. The information can be transferred to the majority logic circuit through a short route employing a small number of sense amplifiers. As a result, an equivalent function can be realized with a far smaller hardware size than the heretofore proposed memory.

Furthermore, since the distance from the memory means to the majority logic circuit can be short, the probability of a change in information in the middle of a transfer is very small. Hence, a memory of high reliability can be provided. In addition, the memory can be easily integrated on a single chip together with other functions. For instance, it can be easily assembled in a microprocessor chip. Accordingly, the present invention is applicable widely from a large-sized system such as a banking system to a small system such as IC cards.

Still further, control for making latch means pass through can be realized by adding only a simple test circuit. As a result, memory cells can be tested by making the majority logic circuit ineffective.

EMBODIMENTS

Figure 1:
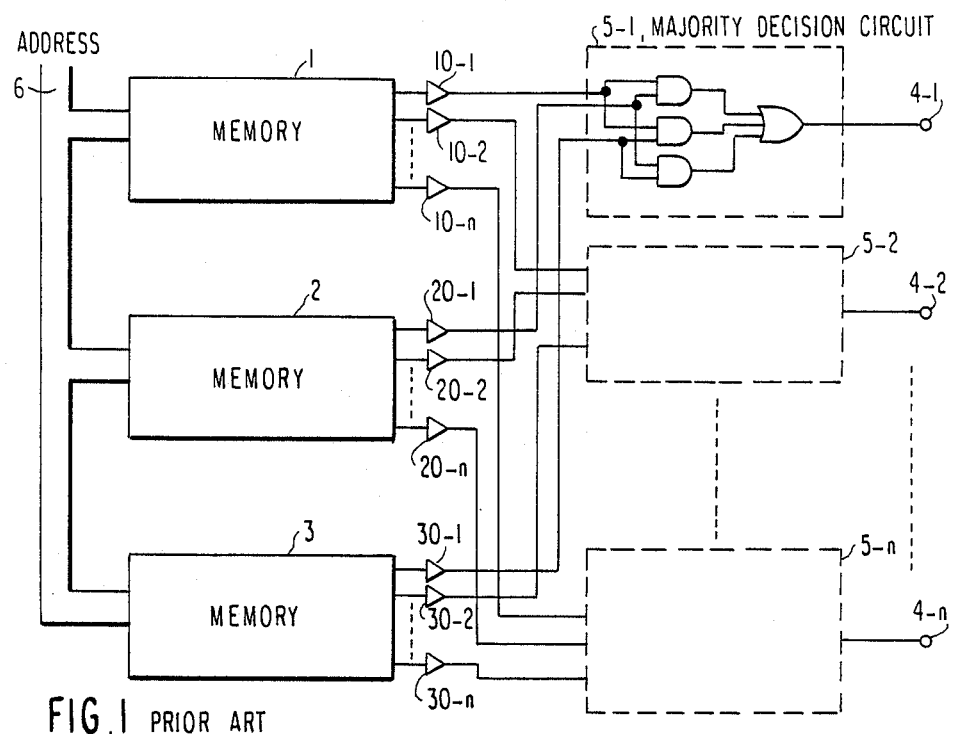
FIG. 1 is a block diagram of a conventional memory.

At first, description will be provided of a block diagram of a heretofore proposed memory as shown in FIG. 1.

n bits of information are recorded in a memory 1, and the same information is recored also in memories 2 and 3. The information recorded in the respective memories are all written at the same address locations. The respective memories are simultaneously accessed by a single address applied commonly thereto through an address bus 6, and the information is read out of the respective memories in parallel. The respective bits of the read information are simultaneously input to majority decision circuits 5-1 to 5-n (one such circuit being provided for each bit of information) through sense amplifiers 10-1 to 10-n, 20-1 to 20-n and 30-1 to 30-n, respectively. Each majority decision circuit is composed of a well-known combination circuit of AND gates and an OR gate as shown in a dotted block 5-1. Since it is self-evident that majority logic operation can be executed by this circuit, further explanation thereof will be omitted. The results of the majority logic operation are derived from output terminals 4-1 to 4-n.

According to this construction, even if information within any one memory among the memories 1 through 3 should change, the information within the remaining two memories still will be the same, and hence the correct information still is output.

However, as illustrated in the figure, the memory in the prior art necessitates a great many sense amplifiers, and so, it is not suitable for IC conversion. In addition, since the number of signal lines extending from the sense amplifiers to the majority logic circuits is large and moreover crossed wirings are necessitated, it has a shortcoming that information which is being transferred is liable to be subjected to electric advance effects.

Figure 2:
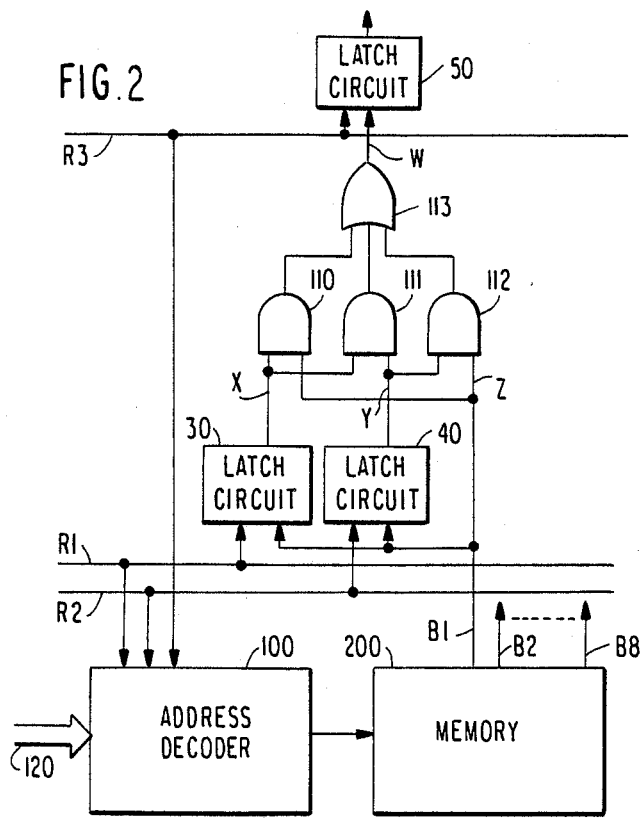
FIG. 2 is a block diagram of one embodiment of the present invention.

FIG. 2 is a block diagram which conceptually illustrates an essential part of one embodiment of the present invention. Essential elements are an address decoder 100, a memory 200, a majority logic operation circuit (AND gates 110, 111, 112, and an OR gate 113), and latch circuits 30, 40 and 50. It is to be noted that with regard to the majority logic circuit, only circuitry corresponding to one bit is illustrated. Here, it is assumed that each information recorded in the memory 200 consists of 8 bits. Access is made to the memory 200 by an output signal of the address decoder 100 decoding an address which is input via an address bus 120, and 8 bits of information per address is output through signal lines $B_1$ to $B_8$. It is to be noted that each bit is transferred to the signal line via a sense amplifier (not shown) provided within the memory 200. The latch circuit 30 stores, in response to a latch timing signal $R_1$, a bit read out on the signal line $B_1$. This latch timing signal $R_1$ is further supplied to the address decoder 100 as a read timing signal. Likewise, the latch circuit 40 stores a bit on the signal line $B_1$ in response to a latch timing signal $R_2$. Furthermore, the latch timing signal $R_2$ is applied to the address decoder 100 and used as a read timing signal. On the other hand, a latch timing signal $R_3$ is applied to the address decoder 100 as a read timing signal, and also supplied to the latch circuit 50 as a latch timing signal, which stores an output W of the OR gate 113 in the majority decision circuit.

In FIG. 2, three sets of the same information are written at different addresses $a_1$, $a_2$ and $a_3$, respectively, of the memory 200. Since the commonly known technique can be employed for writing, explanation of the circuit therefor and its operation will be omitted here.

When information is read out of the memory 200, at first the address $a_1$ is decoded by the address decoder 100. The timing thereof is controlled by the latch timing signal $R_1$. As a result of decoding, a word line corresponding to the address $a_1$ in the memory 200 is selected, and the 8 bits of the information written at that address are respectively output on the corresponding signal lines $B_1$ to $B_8$ via sense amplifiers. The bit output on the signal line $B_1$ is temporarily stored in the latch circuit 30. Thereafter, the next address $a_2$ is input to the address decoder 100 and is decoded under control of the latch timing signal $R_2$. As a result, the 8 bits of the information recorded at the address $a_2$ in the memory 200 are output on the same signal lines $B_1$ to $B_8$ via the same sense amplifiers. At this moment, the bit output on the signal line $B_1$ is stored in the latch circuit 40 according to the latch timing signal $R_2$. It is to be noted that the latch circuit 30 reserves the bit information at the address $a_1$ which has been stored previously. Subsequently, the latch timing signal $R_3$ and the address $a_3$ are input to the address decoder 100, and thereby the information at the address $a_3$ in the memory 200 is input through the same sense amplifiers and the same signal lines to the AND gate 112 of the majority logic circuit as a datum Z. On the other hand, the output of the latch circuit 30 is input to the AND gate 110 and the AND gate 111 as a datum X, while the output of the latch circuit 40 is input to the AND gates 111 and 112 as a datum Y. Here it will be readily understood that the datum X is the datum at the address $a_1$, the datum Y is the datum at the address $a_2$ and a datum Z is the datum at the address $a_3$.

When the three sets of information have been read out, a logic operation is executed in the majority circuit, and thereby an output is obtained according to the truth table shown in Table 1.

TABLE 1

| Case | Bit X | Bit Y | Bit Z | Output W |
|---|---|---|---|---|
| i | 1 | 1 | — | 1 |
| ii | 1 | — | 1 | 1 |
| iii | — | 1 | 1 | 1 |
| iv | 1 | 1 | 1 | 1 |
| v | 0 | 0 | — | 0 |
| vi | 0 | — | 0 | 0 |
| vii | — | 0 | 0 | 0 |
| viii | 0 | 0 | 0 | 0 |

In Table 1, the symbol "—" represents an indefinite or "don't care" state, that is, it represents the fact that a correct datum may have become incorrect for any reason. As will be apparent from Table 1, in the case where information (for instance, "1") written in the bit $B_1$ has been correctly recorded at the three addresses $a_1$, $a_2$ and $a_3$ and it has been correctly read out (case-iv), the output will become "1". However, in the event that in the bit $B_1$ at any one address, either an erroneous datum (an intermediate level which cannot be identified positively as being either "0" or "1") has been recorded or the datum has changed upon reading (case-i to case-iii), a correct datum "1" can be output at the output because at least two data are correct. It is to be noted that with respect to a datum "0" also, a correct datum always can be output as shown in case-v to case-viii.

As described above, according to the circuit shown in FIG. 2, even if memory defects should arise, correct information always can be read out. Furthermore, for three sets of information each consisting of 8 bits, in contrast to the use of 24 sense amplifiers in the prior art, in the illustrated embodiment the object can be achieved with only 8 sense amplifiers. Still further, since the respective bits can be transferred to the majority decision circuit through the common signal lines $B_1$ to $B_8$, the number of signal lines can be decreased, to be ⅓ the number used in the circuit shown in FIG. 1. Accordingly, circuit integration can be done easily, and also the probability of information changing in the middle of reading would become very small. As decribed above, a memory having a high reliability can be formed in a smaller region than that in the prior art by reading out information on a time-division basis and by controlling timing of majority decision processing by means of latch circuits.

A preferred embodiment of the present invention will be described with reference to FIGS. 3 to 6.

Figure 3:
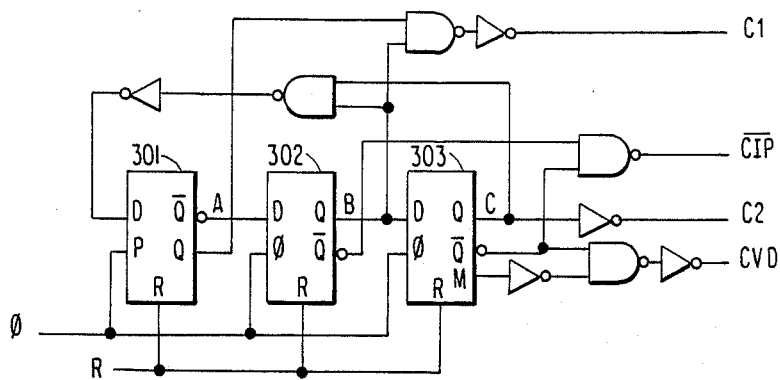
FIG. 3 is a circuit block diagram showing a timing signal generator circuit.
Figure 4:
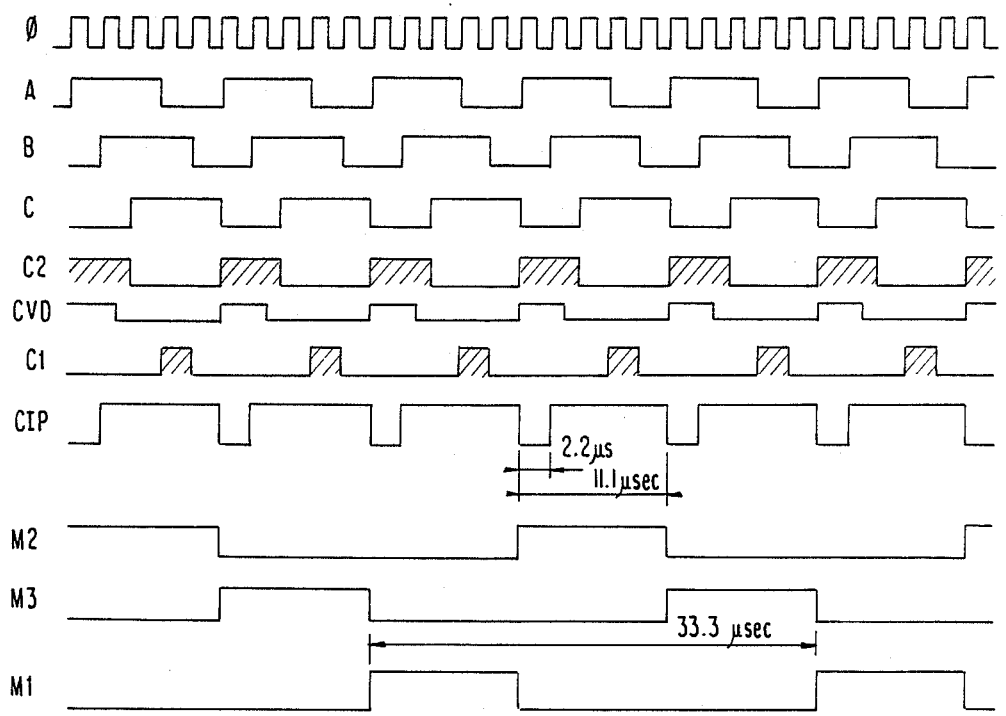
FIG. 4 is a timing chart of timing signals.

FIG. 3 is a block diagram of a timing signal generator circuit for producing necessary timing signals. Three flip-flops 301 to 303 receiving a basic clock $\phi$ are cascaded to form a frequency divider circuit. Pulse signals as shown in the timing chart in FIG. 4 can be obtained from the respective outputs A, B and C of the frequency divider circuit. Necessary control signals ($C_1$, $C_2$, $\overline{CIP}$ and CVD) as shown in FIG. 4 are produced through respective gate circuits (NAND gates and inverters) on the basis of the outputs of the frequency divider circuit. In this connection, R represents a reset signal. On the basis of these control signals, timing signals $M_1$, $M_2$ and $M_3$ shown in FIG. 4 can be produced.

Figure 5:
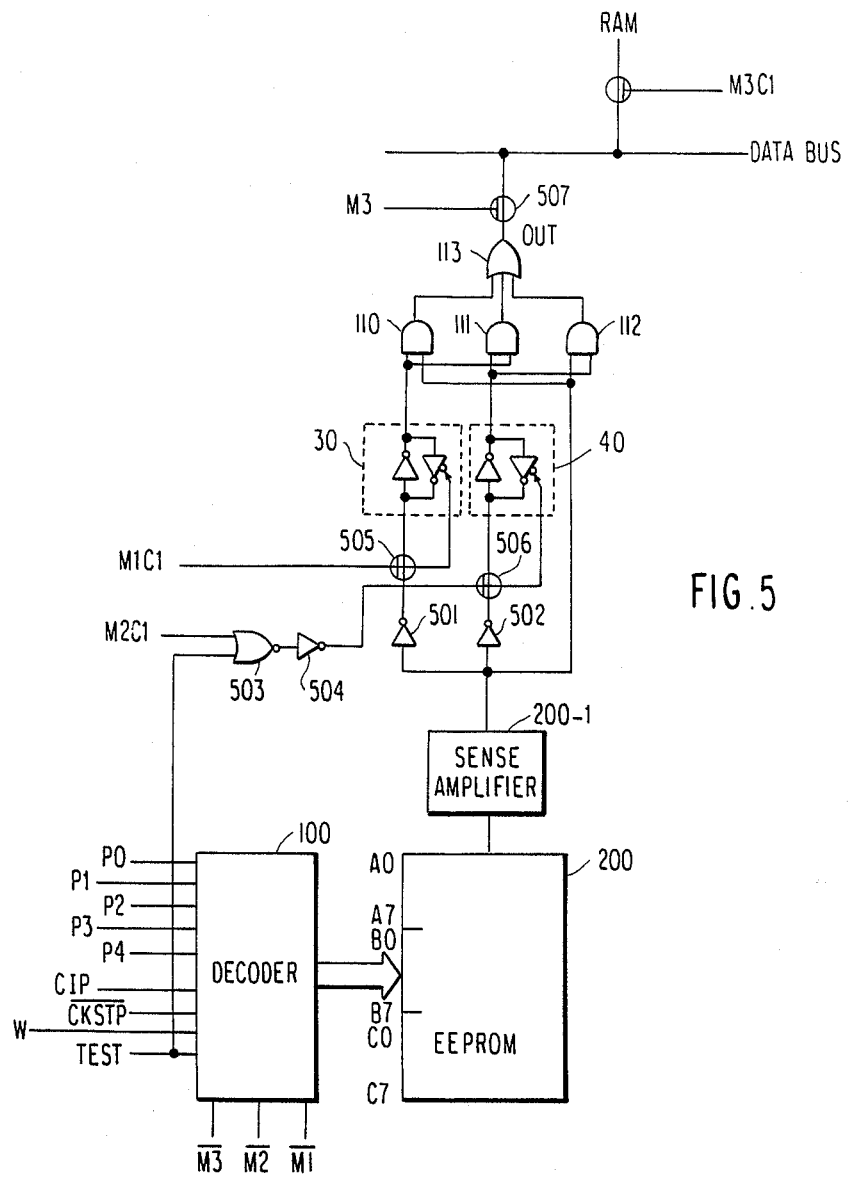
FIG. 5 is a more detailed circuit diagram of the circuit in FIG. 2.

In FIG. 5 a detailed circuit diagram is shown, which includes an address decoder 100, a memory ($E^2$ PROM) 200, a sense amplifier 200-1 for one bit and a majority logic circuit for one bit output. Here, a 5-bit address $P_0$ to $P_4$ is employed so that access can be made to 32 words (1 word/8 bits) of information. To the decoder 100 are input an address $P_0$ to $P_4$, a CIP signal, a $\overline{CKSTP}$ signal, a write control signal (W), a test signal (TEST) and timing signals ($\overline{M_1}$, $\overline{M_2}$ and $\overline{M_3}$). Data read out of the memory 200 are fed via the sense amplifier 200-1 to inverters 501, 502 and an AND gate 112. The output of the inverter 501 is input to a latch 30 via a switching transistor 505 which is turned on by the timing signals $M_1$ and $C_1$. On the other hand, the output of the inverter 502 is input to a latch 40 via a switching transistor 506 which is turned on by a signal that is produced by the fact that an output of a NOR gate 503 receiving the timing signals $M_2$ and $C_1$ is inverted by an inverter 504. The latches 30 and 40 are formed of well-known flip-flops. An output of an OR gate 113 in the majority decision circuit is transferred to a data bus via a switching transistor 507 which is turned on by the timing signal $M_3$. The transferred data could be stored, if necessary, in a RAM via a switching transistor 508.

When the address $a_1$ is input to the decoder 100, locations $A_0$ to $A_7$ in the memory ($E^2$ PROM) 200 are selected, and 8-bit data are read out. The read datum is stored in the latch 30 at the timing of the $M_1$ $C_1$ signal. Subsequently, when the address $a_2$ has been input to the decoder 100, locations $B_0$ to $B_7$ in the memory 200 are selected, and 8-bit data are read out. This datum is stored in the latch 40 at the timing of the $M_2$ $C_1$ signal. Thereafter, in response to the address $a_3$, 8-bit data at locations $C_0$ to $C_7$ in the memory 200 are read out, and the datum is input to AND gates 111 and 112 via the sense amplifier 200-1. At this moment, the outputs of the latches 30 and 40 are also input to the AND gates, and thereby majority decision processing is effected. The result is output to the data bus via an OR gate 113 at the timing of the $M_3$ signal.

Furthermore, if a test signal (TEST) is input, then the decoder 100 accesses the respective cells in the memory 200. On the other hand, the switching transistor 506 is turned on, and thereby input to the latch 40 is permitted. As a result, the latch 40 becomes a through-state, hence the bit data read out at every $M_1 C_1$ timing are input to the three AND gates 110 to 112 substantially at the same time. Accordingly, the inherent function of the majority circuit is suppressed, and the read-out bit data are in themselves transferred to the data bus at the timing of $M_3$. Accordingly, the respective cells can be checked by checking data on the data bus.

Figure 6:
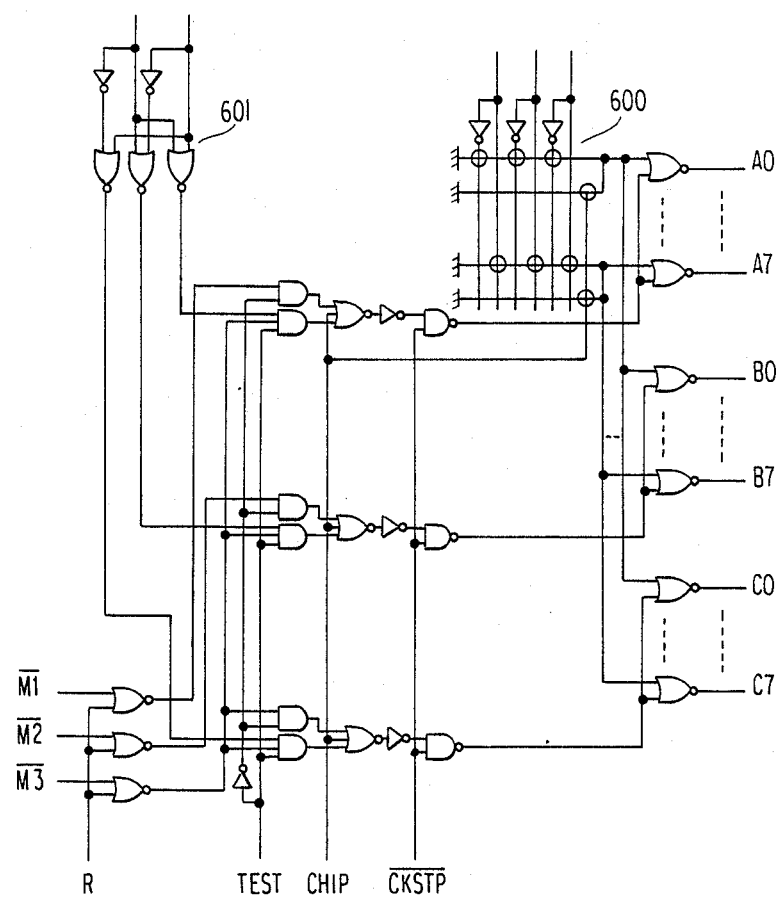
FIG. 6 is a detailed circuit diagram of an address decoder.

FIG. 6 shows a detailed circuit of the address decoder 100. Three bits $P_0$ to $P_2$ of the address are decoded by a decoder circuit 600, and the decoded result is output to NOR gates of $A_0$ to $A_7$, $B_0$ to $B_7$ and $C_0$ to $C_7$, respectively. On the other hand, the remaining two bits $P_3$ and $P_4$ are input to a block select circuit 601. The respective addresses are used as signals for selecting the outputs of the decoder 600 via predetermined gates in response to the timing signals $\overline{M}_1$, $\overline{M}_2$ and $\overline{M}_3$. Furthermore, under control of TEST, CIP and $\overline{CKSTP}$ signals, a test mode can be established.

Figure 7:
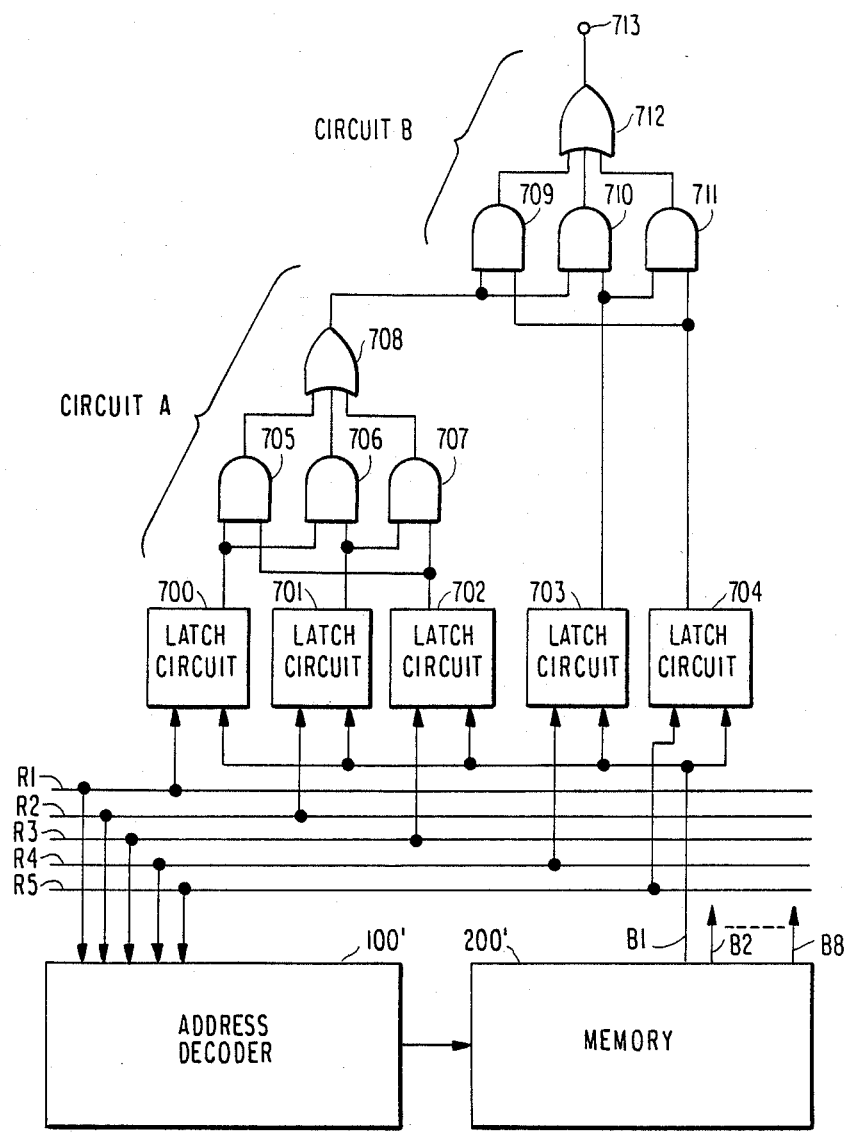
FIG. 7 is a block diagram of another embodiment of the present invention.

FIG. 7 is a block diagram of another embodiment of the present invention. Here, a circuit for making majority decision for five sets of information is provided. An address decoder 100' accesses five different addresses in response to five latch timing signals $R_1$ to $R_5$. In a memory 200', the same sets of information are recorded respectively at five addresses to which access is to be made. An information at an address $a_1$ is stored in a latch 700 by an $R_1$ signal which is a latch timing signal, information at an address $a_2$ being stored in a latch 701 by an $R_2$ signal and information at an address $a_3$ being stored in a latch 702 by an $R_3$ signal. As a result, a majority decision for three sets of information is made at first in a circuit A and the output is derived from an OR gate 708. On the other hand, information read out by an $R_4$ signal is stored in a latch 703 and information read out by an $R_5$ signal is stored in a latch 704. These sets of information are combined with the output of the OR gate 708, and majority decision is made therefor in a circuit B. As a result, a majority decision operation for five sets of information is executed, and hence, information having a higher reliability can be derived from a memory.

EFFECT OF THE INVENTION

As described above, according to the present invention, whatever kind of memory it may be, it becomes possible to deal with information having a high reliability by means of a small hardware circuit. Accordingly, even if it is very important information, it can be recorded in the memory with security. Especially, in a non-volatile memory whose reliability is lowered as the period of use is prolonged, the effect of the present invention is remarkable.

I claim:

1. An integrated circuit device comprising:
a memory having at least first, second and third memory locations;
an address decoder coupled to said memory;
a majority logic circuit having first, second and third input ends and an output end;
a single sense amplifier coupled to said memory such that data read out of said first to third memory locations are all transmitted through said single sense amplifier;
a common signal line coupled to an output end of said sense amplifier;
a first latch circuit coupled to said first input end of said majority logic circuit;
a second latch circuit coupled to said second input end of said majority logic circuit;
first means for operatively coupling said common signal line to said first latch circuit in response to a first control signal;
second means for operatively coupling said common signal line to said second latch circuit in response to a second control signal;
third means for coupling said common signal line to said third input end of said majority logic circuit;
fourth means coupled to said output end of said majority logic circuit for operatively deriving the output signal of said majority logic circuit in response to a third control signal;
fifth means for writing identical data to each of said first, second and third memory locations;
sixth means for receiving said first control signal and allowing said address decoder and said memory to output said data from said first memory location to said common signal line in response to a first address signal and at the same time allowing said first means to couple said common signal line to said first latch circuit;
seventh means for receiving said second control signal and allowing said address decoder and said memory to output said data from said second memory location to said common signal line in response to a second address signal applied later in time than said first address signal and at the same time allowing said second means to couple said common signal line to said second latch circuit; and
eighth means for receiving said third control signal and allowing said address decoder and said memory to output said data from said third memory location to said common signal line in response to a third address signal applied later in time than said second address signal and at the same time allowing said fourth means to derive the output of said majority logic circuit.

2. The device as claimed in claim 1, further comprising:
test signal applying means for receiving a test signal simultaneously with application of said first control signal; and
ninth means, coupled to said second means and said address decoder means and said test signal applying means, for making said second means operative and allowing said address decoder and said memory to read said data from said memory to said common signal line in response to an address signal applied simultaneously with said first control signal and said test signal,
whereby the data read out of one of said first, second, and third memory locations is applied to the first through third input ends of said majority logic circuit simultaneously to enable test operation of said memory.

3. An integrated circuit device comprising:
a memory;
an address decoder connected to said memory;
a first majority logic circuit having first, second, and third input ends and an output end;
a second majority logic circuit having first, second and third input ends and an output end;
a common signal line coupled to said memory;

first, second, and third latches coupled to said first, second and third input ends of said first majority logic circuit, respectively;

fourth and fifth latches coupled to said first and second input ends of said second majority logic circuit;

means for coupling said output end of said first majority logic circuit to said third input end of said second majority logic circuit;

means for coupling said output end of said second majority logic circuit to a memory output terminal;

means for coupling said common signal line to said first through fifth latches;

means for receiving first to fifth control signals applied at different timings; and means coupled to said receiving means for enabling said address decoder and one of said first to fifth latches in response to respective one of said first to fifth control signals.

* * * * *

UNITED STATES PATENT AND TRADEMARK OFFICE
CERTIFICATE OF CORRECTION

PATENT NO. : 4,748,594

DATED : May 31, 1988

INVENTOR(S) : Iida

It is certified that error appears in the above-identified patent and that said Letters Patent is hereby corrected as shown below:

COLUMN 2, LINE 50   Before "hence" delete "the" (first occurence) insert --and--;

COLUMN 3, LINE 17   Delete "amplifieron" and insert amplifier on--;

COLUMN 3, LINE 67   Delete "n" and insert --$\underline{n}$--;

COLUMN 3, LINE 68   Delete "recored" and insert --recorded--;

Signed and Sealed this

Eighth Day of November, 1988

Attest:

DONALD J. QUIGG

Attesting Officer

Commissioner of Patents and Trademarks